United States Patent [19]
Balter

[11] Patent Number: 4,781,520
[45] Date of Patent: Nov. 1, 1988

[54] POLAR-COORDINATE MANIPULATOR FOR VACUUM APPLICATION

[75] Inventor: Valentin Balter, Cupertino, Calif.

[73] Assignee: Huntington Mechanical Laboratories, Inc., Mountain View, Calif.

[21] Appl. No.: 143,635

[22] Filed: Jan. 13, 1988

[51] Int. Cl.$^4$ ............................................. B65G 54/00
[52] U.S. Cl. ..................... 414/751; 74/18.2; 74/89.15; 74/479; 901/17
[58] Field of Search ............ 414/744 R, 744 A, 744 B, 414/744 C, 749, 751, 752, 753, 8; 901/14, 17, 40; 74/18.2, 89.15, 479

[56] References Cited

U.S. PATENT DOCUMENTS

| | | | |
|---|---|---|---|
| 3,625,378 | 12/1971 | Attiz | 414/8 |
| 4,030,615 | 6/1977 | Guggi et al. | 414/8 |
| 4,128,019 | 12/1978 | Kupka | 74/89.15 |
| 4,502,830 | 3/1985 | Inaba et al. | 901/17 |

Primary Examiner—Robert J. Spar
Assistant Examiner—Donald W. Underwood
Attorney, Agent, or Firm—David Pressman

[57] ABSTRACT

A polar-coordinate manipulator for vacuum application, e.g., for positioning of a specimen (S) between several operating positions in a vacuum chamber (16) where the specimen can be subjected to ion implantation or similar treatment or measuring procedures. The device comprises a circular stationary support (12) attached to the flange of vacuum chamber (16). A square-shaped rotary table (22) is rotatingly supported by a circular support (22) and in turn slidingly supports a sliding block (44). The sliding block can be shifted by a micrometer (50) radially with respect to the axis of rotation of the turntable. The sliding block supports a moveable plate (72) which can be shifted along the above-mentioned axis of rotation and carries a rigidly attached rod (92) which penetrates into the vacuum chamber and supports the sample to be treated. The manipulator can position the sample at a target point in a polar coordinate system.

20 Claims, 2 Drawing Sheets

POLAR-COORDINATE MANIPULATOR FOR VACUUM APPLICATION

FIELD OF THE INVENTION

The present invention relates to manipulators, particularly to manipulators for accurate positioning of samples in vacuum chambers.

BACKGROUND

DESCRIPTION OF THE PROBLEM

Manufacturing, testing and studying of semiconductors very often require that a wafer or sample of semiconductor material be transferred in a vacuum chamber from one operating position to another, for example, from an ion-implantation position to a surface-analyzing position. In spite of the fact that positioning of a sample in the vacuum chamber is typically done in polar coordinates (an angle and a radius vector), conventional standard manipulators used for this purpose, such as the model PM-600 of Huntington Mechanical Laboratories, Inc., Mountain View, Calif., have an orthogonal (X, Y) coordinate system with two slides moveable in mutually perpendicular directions. Thus an operator must transpose the polar coordinates to orthogonal coordinates in order to use conventional, standard manipulators; this is an inconvenient and time-consuming operation. For example, if semiconductor manufacturing specification calls for a wafer to be positioned at the polar coordinates of 150° and 22 cm from a reference point and 0° line, the operator must convert this, using trigonometric functions (sine and cosine), or mensuration with a protractor and ruler, to the orthogonal coordinates $X = -19$ cm. $Y = 11$ cm, a time-consuming, and tedius operation which adversely affects any mass-production operation. Furthermore, the orthogonal manipulator is more complicated in construction and more expensive to manufacture, as it requires the use of two micrometers for positioning on two mutually-perpendicular axes.

OBJECTS AND ADVANTAGES OF THE PRESENT INVENTION

Accordingly several objects of the invention are to provide a manipulator for vacuum application which positions a sample directly according to polar coordinates, which has a simple construction, and which is inexpensive to manufacture. Other features and advantages of the invention will be understood after consideration of the ensuing description and the accompanying drawings.

DRAWINGS

Figure 1:
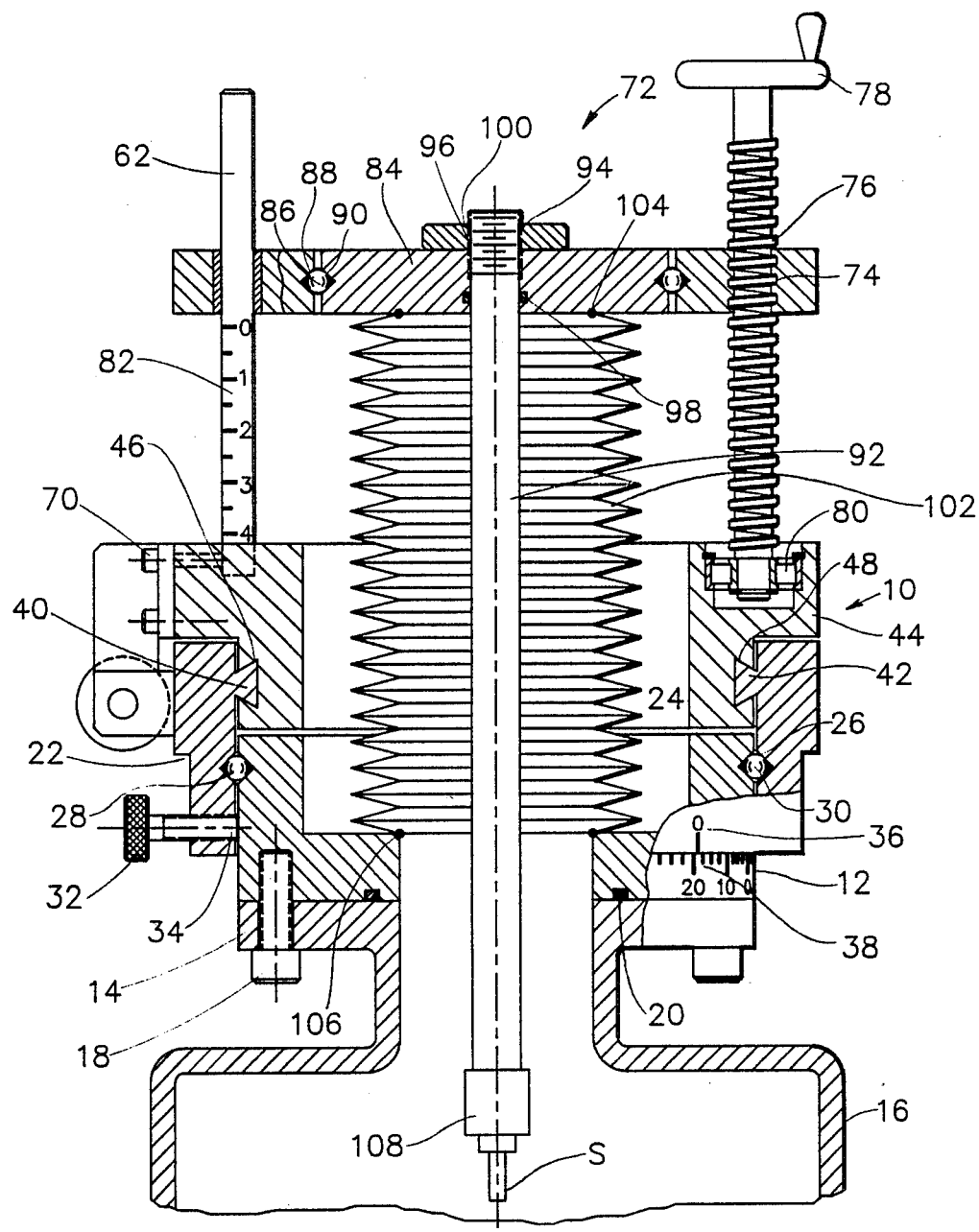
FIG. 1 is a sectional schematic side view of a polar-coordinate manipulator of the present invention.

Reference Numerals Used in the Specification and Drawings

10—polar-coordinate manipulator
12—circular base
14—flange of a vacuum chamber
16—vacuum chamber
18—bolts
20—seal ring
22—turntable
24—central opening
26—V-shaped annular groove of the turntable
28—V-shaped annular groove of the circular base
30—balls
32—screw
34—threaded opening
36—marking line
38—angular scale
40, 42—linear guides
44—slide block
46, 48—dovetail slots
50—micrometer
52—bracket of the turntable
54, 58—lock screw
56—micrometer spindle
60—bracket on the turntable
62, 64, 66, 68—guide columns
70—screw
72—upper plate
74—threaded hole
76—vertical-adjustment screw
78—handle
80—thrust bearing
82—scale
84—central portion of the upper plate
86—balls
88, 90—V-shaped grooves
92—vertical rod
94—outer thread
96—inner thread
98—seal ring
100—nut
102—bellows
104—upper weld seam
106—lower weld seam
108—sample holder
S—sample

FIGS. 1 AND 2

Description of the Preferred Embodiment of the Invention

Figure 2:
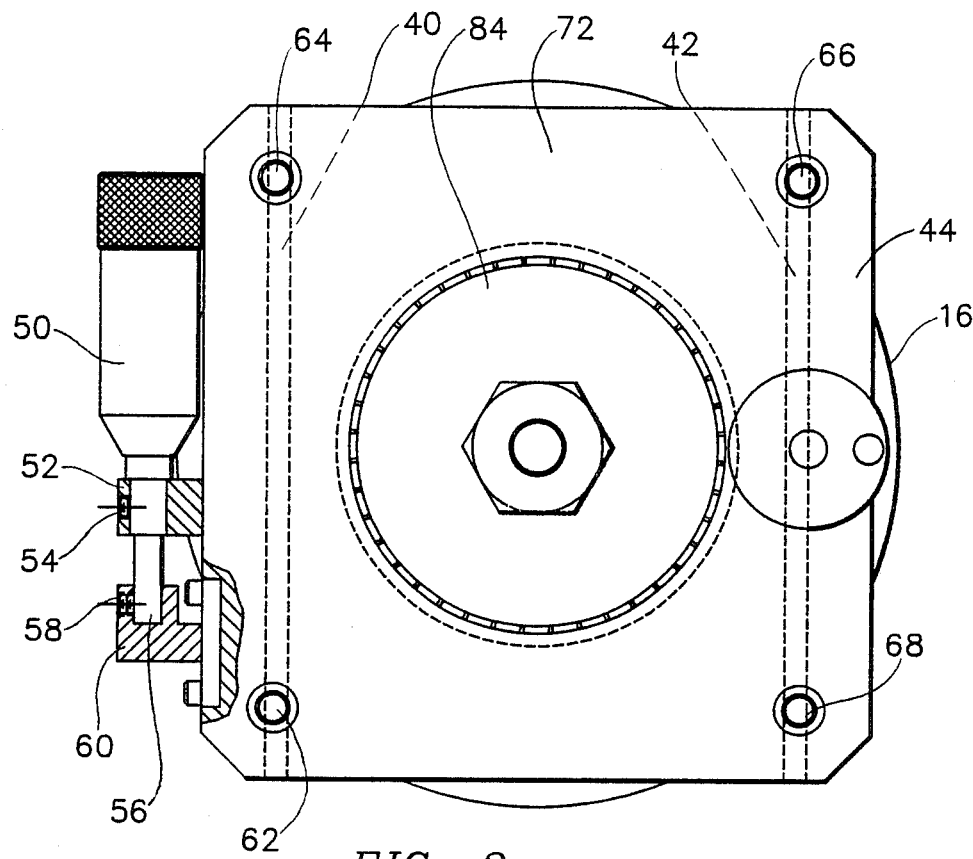
FIG. 2 is a top view of the manipulator of FIG. 1.

A polar-coordinate manipulator 10 of the present invention is shown in FIGS. 1 and 2, where FIG. 1 is a sectional side view and FIG. 2 is a top view of the manipulator.

Manipulator 10 consists of a cup-shaped circular base 12 which contains a scale 38 (discussed infra) and is attached to a flange 14 of a vacuum chamber 16 by means of bolts 18. The joint between base 12 and flange 14 is sealed by a seal ring 20.

Circular base 12 rotatingly supports a turntable 22. As shown in FIG. 2, turntable 22 has a square-shaped configuration with a circular central opening 24 (FIG. 1). An annular V-shaped groove 26 is cut in the inner surface of opening 24. A similar V-shaped groove 28 is formed in the outer surface of circular base 12. A space between grooves 26 and 28 is filled with ball bearings 30, are maintained in a circumferentially spaced relationship by means of a conventional separator (not shown). Thus, turntable 22 can be turned on balls 30 around circular base 12 into any required angular position. Any such position can be fixed with respect to circular base 12 by a screw 32 which is threaded into a tapped transverse opening 34 which passes through the wall of turntable 22. The angular position of turntable 22 on circular base 12 is measured by reading the position of a mark line 36 on the outer surface of turntable 22 with respect to scale 38 on circular base 12.

On its inner surface above central opening 24, turntable 22 has linear guides 40 and 42. In FIG. 2 these guides are shown by broken lines 40 and 42. The guides have a dovetail cross section and are located on opposite sides of turntable 22 (FIG. 1).

Guides 40 and 42 slidingly support a slide block 44 which has respective dovetail slots 46 and 48 for engagement with guides 40 an 42 of turntable 22. For accurate positioning of slide block 44 with respect to turntable 22, slide block 44 supports a micrometer 50, e.g., by a bracket 52 with a lock screw 54. A spindle 56 of micrometer 50 is attached, by means of a lock screw 58, to a bracket 60 on turntable 22. A micrometer with a non-rotating spindle, e.g., Series 110 or Series 153 produced by Mitutoyo Co., Japan, is suitable for the purpose of the invention. The Series 110 micrometer has a working range of 0 to 2.5 mm with positioning accuracy of 0.0001 mm, and the Series 153 micrometer has a working range of 0 to 25 mm with positioning accuracy of 0.001 mm.

The upper part of slide block 44 supports four guide columns 62, 64, 66, and 68 which can be press fit into holes (not shown) formed in the upper surface of slide 44 and, if necessary, can be fixed by screws 70. The guide columns support an upper plate 72 which can slide on the columns in a vertical direction. As shown in FIG. 2, plate 72 has the same square-shaped outer configuration as turntable 22 and slide block 44. Near one of its sides, plate 72 has a threaded hole 74, threaded into which is a vertical-adjustment screw 76 with a handle 78 on its upper end. The lower end of screw 76 is supported by slide block 44 through a thrust bearing 80.

The vertical position of upper plate 72 on the guide columns is determined by means of a scale 82 which is formed on one of the columns, e.g., on column 62.

A central portion 84 of upper plate 72 is installed rotatingly with respect to the outer portion of the plate by means of ball bearings 86 and V-shaped grooves 88 and 90 of the same type as ball bearings 30 and grooves 26 and 28 described above.

Inner or rotating portion 84 of upper plate 72 rigidly supports a vertical rod which is directed downward and extends into the working space of vacuum chamber 16. The upper end of the rod can be removably attached to plate 72 through the threaded connection, e.g., by outer thread 94 formed on the upper end of rod 92 and inner thread 96 formed in the central opening of rotating portion 84 of the plate. The scope of the invention is not limited to this arrangement since rod 92 can be welded to rotating portion 84. In any case the connection must be sealed, e.g., by a seal ring. In the case of the threaded connection, the upper end of rod 92 can be locked by a nut 100.

A space between rotating portion 84 of upper plate 72 and the working cavity of the vacuum chamber is sealed by a bellows 102. The upper end of bellows 102 which may be made from stainless steel is welded by a seam 104 to the lower surface of rotating portion 84 and the lower end of bellows 102 is welded to circular base 12 by a seam 106. Both weld seams must be reliably sealed.

The lower end of vertical rod 92 supports a sample holder 108, which supports a sample S, e.g., a semiconductor wafer, which is to be manipulated within vacuum chamber 16.

Thus, in the arrangement described above, the entire assembly (consisting of turntable 22, slide block 44, guide columns 62, and the outer portion of upper plate 72) can rotate on bearings formed by balls 30 and balls 86 around a stationary platform (formed by vacuum chamber 16, circular base 12, bellows 102, and central portion 84 of upper plate 72). If, at the same time slide block 44 is moved radially, so that rod 92 is offset with regard to the center of rotation, then rod 92, and hence sample S, will move in a planetary (circular) path around the center of rotation of turntable 22.

Although the parts can be made from any suitable material, it is recommended that all the parts, including bellows 102, be made of stainless steel.

Figure 3:
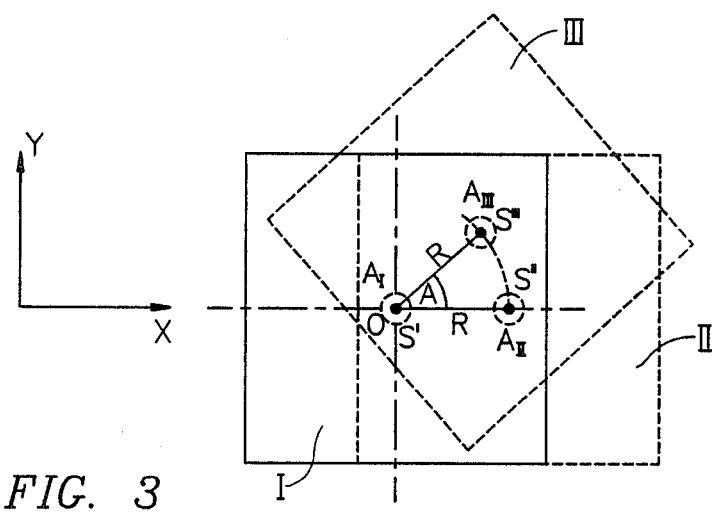
FIG. 3 is a diagram for explaining the principle of positioning of the sample by means of the polar-coordinate manipulator.

The shapes and dimensions of the parts will depend on the particular application. According to one practical embodiment, the manipulator of the invention provides the following movements: X-axis 19.05 mm; Y-axis 19.05 mm; and Z-axis 50.8 mm, where X and Y axes are shown in FIG. 3, which is a schematic plan view explaining the principle of positioning of the sample in the vacuum chamber. Z-axis is a vertical axis.

FIGS. 1-3

Operation

Polar coordinate manipulator 10 operates in the following manner:

Prior to installation onto vacuum chamber 16, sample S is attached to sample holder 108 and then preassembled manipulator 10 is attached to flange 14 of vacuum chamber 16 by bolts 18. Assume that directly after installation, slide block 44 corresponds to position I shown in FIG. 3 by solid lines, and that sample S, which is now position at point $A_I$ must be relocated to point $A_{III}$, which is on a radius R which extends from the center O of rotation of rotary table 22. In other words, sample S must be polarized at point $A_{III}$ on polar coordinates (A, R) in a polar coordinate system having axis X parallel to the side of turntable 22 and angle A of rotation around the center of circular base 12.

Positioning of sample S at a target point is achieved by first displacing slide block 44 along linear guides 42 with respect to turntable 22 from point $A_I$ to an intermediate position $A_{II}$, i.e., at the required radial distance R from coordinate center O. This is achieved by turning the head of micrometer 50. As the micrometer head is installed on slide block 44 and the non-rotating spindle of micrometer 50 is attached to bracket 60 on turntable 22, rotation of the micrometer head will displace slide block 44 with respect to turntable 22 along guides 42. The entire unit (consisting of turntable 22, slide block 44, guide rods 62, and upper plate 72) is then turned around the stationary part, i.e., vacuum chamber 16 and circular support 14. In the course of this motion, sample S will move in a planetary path (parallel to itself) around center O. Thus it can be moved through angle A, which is measured on scale 38, until point $A_{II}$ will coincide with point $A_{III}$ in FIG. 3. Now specimen S is aligned in a targeted with the working position, e.g., with an ion-implantation gun (not shown) built into vacuum chamber 16. For vertical alignment to the target position, rod 92, and hence sample S, are moved in a vertical direction by rotating handle 78. As a result, rotation of screw 76 will cause vertical displacement of upper plate 72 along guides 82 in a required direction until the target position of sample S is reached.

Bellows 102 expands and contracts and thus compensates for axial and radial displacements of moveable parts with respect to stationary parts.

After completion of the ion-implantation operation in the manner described above, sample S can be repositioned to another polar coordinate, as required by the manufacturing process.

Synopsis, Ramification, and Scope

Thus, as has been shown above, the device of the invention provides a simple and reliable means for positioning a sample S at any required polar coordinate point within the working space of a vacuum chamber. In other words, the sample can be positioned at the target point directly in the polar coordinate system without recalculation from orthogonal coordinates. The device has a simple construction and easy to manufacture.

While the present invention has been illustrated in the form of a specific embodiment shown in FIGS. 1 and 2, those skilled in the art will understand that these embodiment has been given only as an example and that many other modifications are possible within the scope of the appended claims. For example, scale 38 can be formed on rotary table 22 and marking line 36 can be applied onto circular base 12. The parts of the manipulator can be made from materials other than stainless steel. Turntable, slides and upper plate may have configurations other than square-shaped, e.g., round, hexagonal, etc. Micrometer 50 can be attached to the turntable and its spindle can be connected to the slide block. Circular base 12 can be made integral with vacuum chamber 16 and turntable may be assembled from two bolted parts. Rod 92 can be permanently welded to upper plate 72, and the upper plate can be attached to a special rotary mechanism. Instead of a manual drive through handle 78, screw 76 can be connected to a pulse motor controlled from a program. The head of the micrometer also can be rotated from a programmable pulse motor, so that together with automatic rotation around the vertical axis, the entire manipulator can be built into an on-line production system. Three or two guide columns 62 can be used instead of four, as shown. Moveable plate 72 can be driven from a hydraulic servomechanism, etc.

Therefore the scope of the invention should be determined, not by the example given, but by appended claims and their legal equivalents.

What I claim is:

1. A polar-coordinate manipulator for vacuum applications, comprising:
   stationary support means for rigid attachment to a mounting flange of a vacuum chamber in sealing engagement with said chamber;
   rotary support means installed in a rotatable manner on said stationary support means;
   sliding means mounted on a pluality of first guides on said rotary support means and capable of sliding along said plurality of first guides in a radial direction with regard to the center of rotation of said rotary means;
   second guide means mounted on said sliding means in a direction parallel to said axis of rotation;
   moveable support means capable of moving along said second guide means in said direction parallel to said axis of rotation, said moveable support having an outer part which slides along said second guide means and an inner part which is mounted rotatingly with respect to said outer part;
   axial drive means installed on said outer part and connected to said sliding means for driving said moveable support means in said direction parallel to said axis of rotation;
   elongated means rigidly connected to said inner part and extending through said sliding means, said rotary support means, and said stationary support means and into said vacuum chamber;
   a sample holder on the end of said elongated means inside said vacuum chamber;
   flexible, stretchable sealing means which surrounds said elongated means and forms a sealed chamber connected to said vacuum chamber;
   means for measuring angular position of said rotary support means on said stationary support means; and
   means for measuring said axial movement of said moveable support along said second guide means.

2. The polar-coordinate manipulator of claim 1 wherein said stationary support means comprises a cup-shaped element having an annular groove on its outer periphery, said rotary support means has an opening with an annular groove in the wall of said opening, and is supported rotatingly on said stationary support means by ball bearings inserted between both said grooves.

3. The polar coordinate manipulator of claim 1 wherein said second guide means comprises at least one column attached to said sliding means in said direction parallel to the axis of rotation of said rotary means.

4. The polar coordinate manipulator of claim 1 wherein said outer part comprises a plate with openings fit onto said second guide means.

5. The polar coordinate manipulator of claim 1 wherein said axial drive means comprises a screw which is parallel to said second guide means and is threaded into a threaded hole which is formed in said outer part of said moveable support, said screw being rotatingly supported by a bearing in said sliding means.

6. The polar coordinate manipulator of claim 1 wherein said means for radial displacement of said sliding means with respect to said rotary support means, as well as for measuring the amount of said radial movement, comprises a micrometer, a head of said micrometer being attached to said sliding means and a spindle of said micrometer being attached to said rotary support means.

7. The polar-coordinate manipulator of claim 6 wherein said micrometer has a non-rotating spindle.

8. The polar-coordinate manipulator of claim 1 wherein said elongated means comprises a rod which is removably attached by means of a threaded connection to said inner part of said moveable support.

9. The polar-coordinate manipulator of claim 1 wherein said flexible sealing means comprises a bellows.

10. The polar-coordinate manipulator of claim 9 wherein said bellows is made from stainless steel and is connected to said vacuum chamber and to said inner part by sealed weld seams.

11. The polar-coordinate manipulator of claim 9, further including sealing means between said stationary support and said flange of said vacuum chamber.

12. The polar coordinate manipulator of claim 1 wherein said means for measuring said angular position comprises an angular scale on said stationary support and a marking line on said rotary support means, and wherein said means for measuring axial movement of said moveable support comprises a scale on said second guide means.

13. A polar-coordinate manipulator for vacuum applications, comprising:

a circular stationary support base for rigid attachment by bolts to a mounting flange of a vacuum chamber in sealing engagement with said chamber;

a turntable table which is installed in a rotatable manner on said stationary support base;

a sliding block mounted on a plurality of first guides on said turntable and capable of sliding along said plurality of first guides in a radial direction with regard to the center of rotation of said turntable;

second guide means in the form of at least one cylindrical column rigidly attached to said sliding block in a direction parallel to said axis of rotation;

moveable support means capable of moving along said second guide means in said direction parallel to said axis of rotation, said moveable support means having an outer part which slides along said second guides and an inner part which is rotatable with respect to said outer part;

axial drive means installed on said outer part and connected to said sliding block for driving said moveable support means in direction parallel to said axis of rotation;

a rod rigidly connected to said inner part and extending through said sliding block, said turntable, and said circular stationary support base into said vacuum chamber;

a sample holder on the end of said rod inside said vacuum chamber;

a flexible stretchable sealing means which surrounds said rod and forms a sealed chamber which is in communication with said said vacuum chamber;

means for measuring angular position of said rotary support means on said stationary support means; and means for measuring said axial movement of said moveable support along said second guide means.

14. The polar-coordinate manipulator of claim 13 wherein said circular stationary support base has a cup-shaped configuration and has an annular groove on its outer periphery, and wherein said turntable has an opening with an annular groove in the wall of this opening and is supported in a rotatable manner on said circular stationary support means by ball bearings inserted between both said grooves.

15. The polar coordinate manipulator of claim 13 where said turntable, said sliding block, and said moveable support have square-shaped outer configurations.

16. The polar coordinate manipulator of claim 13 wherein said outer point comprises a plate with openings fit onto said second guide means.

17. The polar coordinate manipulator of claim 13 wherein said axial drive means comprises a screw which is parallel to said second guide means and is threaded into a threaded hole which is formed in said outer part of said moveable support, said screw being rotatingly supported by a bearing in said sliding block.

18. The polar coordinate manipulator of claim 13 wherein said means for radial displacement of said sliding means with respect to said rotary support means, as well as for measuring the amount of said radial movement comprises a micrometer with a non-rotary spindle, a head of said micrometer being attached to said sliding block and a spindle of said micrometer being attached to said turntable.

19. The polar-coordinate manipulator of claim 13 wherein said flexible sealing means comprises a stainless-steel bellows welded by sealed weld seams to said inner part and the bottom of said circular stationary base around said rod; said said means for measuring said angular position comprises an angular scale on said circular stationary support base and a marking line on said turntable, and wherein said means for measuring axial movement of said moveable support comprises a scale on said second guide means.

20. A polar-coordinate manipulator for vacuum application comprising:

a circular stationary support base for rigid attachment by bolts to a mounting flange of a vacuum chamber through a sealing ring;

a square-shaped turntable table which is installed rotatingly on said stationary support base by means of ball bearings inserted between two mating grooves, one of which is formed on the outer periphery of said circular stationary support base and the other on the inner periphery of the opening which is formed in said turntable;

a square-shaped sliding block of the same outer configuration as said turntable, said sliding block having guide grooves and said turntable having guides inserted in a slidable manner into said guide grooves, said guide grooves and guides being parallel to two opposite sides of said square configuration;

at least one cylindrical column rigidly attached to said sliding block in the direction parallel to said axis of rotation;

a moveable plate capable of moving along said cylindrical column in the the direction parallel to said axis of rotation, said moveable plate having an outer part which slides along said column and an inner part which is rotatable with respect to said outer part;

a micrometer with non-rotating spindle with a head of said micrometer being installed on said sliding block and a spindle of said micrometer being connected to said turntable, so that said slide block can be moved along said guides in said direction parallel to said side of said square for a predetermined measured distance;

a rod rigidly connected to said inner part and extending through said sliding block, said turntable, and said circular stationary support base into said vacuum chamber;

a sample holder on the end of said rod inside said vacuum chamber;

a stainless-steel bellows which surrounds said rod and forms a sealed chamber which is in communication with said said vacuum chamber;

an angular scale on said circular support base and a marking line on said turntable for measuring an angular position of said turntable on said circular base; and a scale on said column for measuring a displacement of said moveable plate in the direction parallel to said axis of rotation.

* * * * *

UNITED STATES PATENT AND TRADEMARK OFFICE
CERTIFICATE OF CORRECTION

PATENT NO. : 4,781,520

DATED : November 1, 1988

INVENTOR(S) : Valentin Balter

It is certified that error appears in the above-identified patent and that said Letters Patent are hereby corrected as shown below:

Col. 1, line 35, change "tedius" to --tedious--.

Col. 2, line 60, after "30," insert --which--.

Col. 4, line 36, change "polarized" to --positioned--.

Signed and Sealed this

Fourteenth Day of March, 1989

Attest:

DONALD J. QUIGG

*Attesting Officer*   *Commissioner of Patents and Trademarks*